United States Patent
Hashimoto et al.

(10) Patent No.: US 8,865,589 B2
(45) Date of Patent: Oct. 21, 2014

(54) SEMICONDUCTOR DEVICE AND MANUFACTURING METHOD OF SEMICONDUCTOR DEVICE

(75) Inventors: Takaki Hashimoto, Kanagawa (JP); Yasunobu Kai, Kanagawa (JP); Toshiya Kotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 13/614,217

(22) Filed: Sep. 13, 2012

(65) Prior Publication Data

US 2013/0241073 A1  Sep. 19, 2013

(30) Foreign Application Priority Data

Feb. 22, 2012  (JP) ................. 2012-036187

(51) Int. Cl.
| | |
|---|---|
| *H01L 21/027* | (2006.01) |
| *H01L 21/768* | (2006.01) |
| *H01L 21/311* | (2006.01) |
| *H01L 23/528* | (2006.01) |
| *H01L 21/033* | (2006.01) |
| *H01L 27/115* | (2006.01) |

(52) U.S. Cl.
CPC ............ *H01L 23/528* (2013.01); *H01L 21/768* (2013.01); *H01L 21/31144* (2013.01); *H01L 21/0337* (2013.01); *H01L 27/11519* (2013.01); *Y10S 438/947* (2013.01)
USPC ........... 438/637; 438/671; 438/696; 438/699; 438/947

(58) Field of Classification Search
CPC .............. H01L 21/027; H01L 21/0334; H01L 21/0337; H01L 21/0338; H01L 21/31144; H01L 21/768; H01L 21/76802
USPC ......... 438/637, 671, 694, 696, 703, 699, 945, 438/947, 736, 745
See application file for complete search history.

(56) References Cited

U.S. PATENT DOCUMENTS

| | | |
|---|---|---|
| 7,897,058 B2 | 3/2011 | Van Haren et al. |
| 2007/0187358 A1 | 8/2007 | Van Haren et al. |
| 2008/0035956 A1 | 2/2008 | Manning |

(Continued)

FOREIGN PATENT DOCUMENTS

| | | |
|---|---|---|
| JP | 2007-048837 | 2/2007 |
| JP | 2007-281428 | 10/2007 |

(Continued)

OTHER PUBLICATIONS

Notice of Rejection issued by the Japanese Patent Office on Aug. 19, 2014, for Japanese Patent Application No. 2012-036187, and English-language translation thereof.

*Primary Examiner* — Matthew W Such
*Assistant Examiner* — Scott Stowe
(74) *Attorney, Agent, or Firm* — Finnegan, Henderson, Farabow, Garrett & Dunner, L.L.P.

(57) ABSTRACT

According to one embodiment, a semiconductor device includes a plurality of wires arranged in parallel at a predetermined pitch, a plurality at first contacts that are each connected to an odd-numbered wire among the wires and are arranged in parallel in an orthogonal direction with respect to a wiring direction of the wires, and a plurality of second contacts that are each connected to an even-numbered wire among the wires and are arranged in parallel in an orthogonal direction with respect to the wiring direction of the wires in such a way as to be offset from the first contacts in the wiring direction of the wires, in which the first contacts are offset from the second contacts by a pitch of the wires in an orthogonal direction with respect to the wiring direction of the wires.

7 Claims, 20 Drawing Sheets

(56) References Cited

U.S. PATENT DOCUMENTS

2009/0269682 A1  10/2009  Nishimura
2010/0193917 A1*  8/2010  Olson .......................... 257/618
2010/0221920 A1   9/2010  Sandhu et al.
2011/0049601 A1   3/2011  Kai et al.
2011/0065049 A1   3/2011  Kushibiki et al.

FOREIGN PATENT DOCUMENTS

| | | |
|---|---|---|
| JP | 2009-267112 | 11/2009 |
| JP | 2011-059579 | 3/2011 |
| JP | 2011-071468 | 4/2011 |
| JP | 2011-258822 | 12/2011 |
| JP | 2012-064898 | 3/2012 |

* cited by examiner

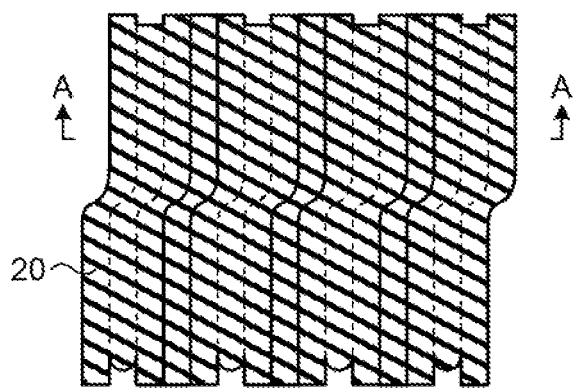
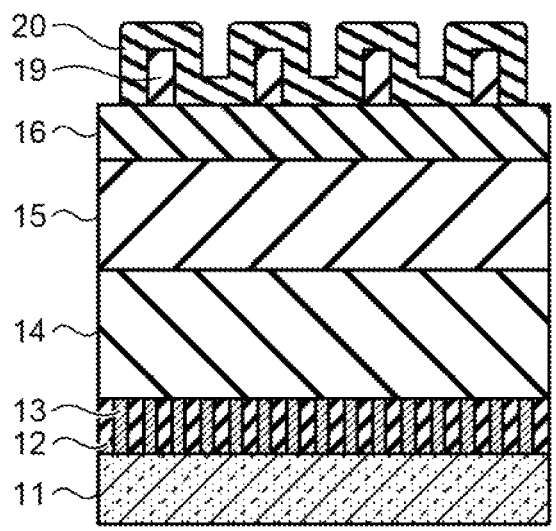

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from Japanese Patent Application No. 2012-36187, filed on Feb. 22, 2012; the entire contents of which are incorporated herein by reference.

FIELD

Embodiments described herein relate generally to a semiconductor device and a manufacturing method of a semiconductor device.

BACKGROUND

The array pitch of contacts of wires becomes small with the scaling of a line and space of the wires, therefore, it has becomes difficult to lay out the contacts. If the contacts are arranged offset from each other to lay out the contacts, the chip size increases by the amount of offset of the contacts.

BRIEF DESCRIPTION OF THE DRAWINGS

FIG. 6A is a plan view illustrating the manufacturing method of the contact region of the semiconductor device according to the third embodiment and FIG. 6B is a cross-sectional view out along line A-A in FIG. 6A;

in FIG. 7A;

DETAILED DESCRIPTION

In general, according to one embodiment, a plurality of wires, a plurality of first contacts, and a plurality of second contacts are included. The wires are arranged in parallel at a predetermined pitch. The first contacts are each connected to an odd-numbered wire among the wires and are arranged in parallel in an orthogonal direction with respect to a wiring direction of the wires. The second contacts are each connected to an even-numbered wire among the wires and are arranged in parallel in an orthogonal direction with respect to the wiring direction of the wires in such a way as to be offset from the first contacts in the wiring direction of the wires. The first contacts are offset from the second contacts by a pitch of the wires in an orthogonal direction with respect to the wiring direction of the wires.

A semi conductor device and a manufacturing method of the semiconductor device according to the embodiments will be explained below with reference to the drawings. The present invention is not limited to these embodiments.

(First Embodiment)

Figure 1:
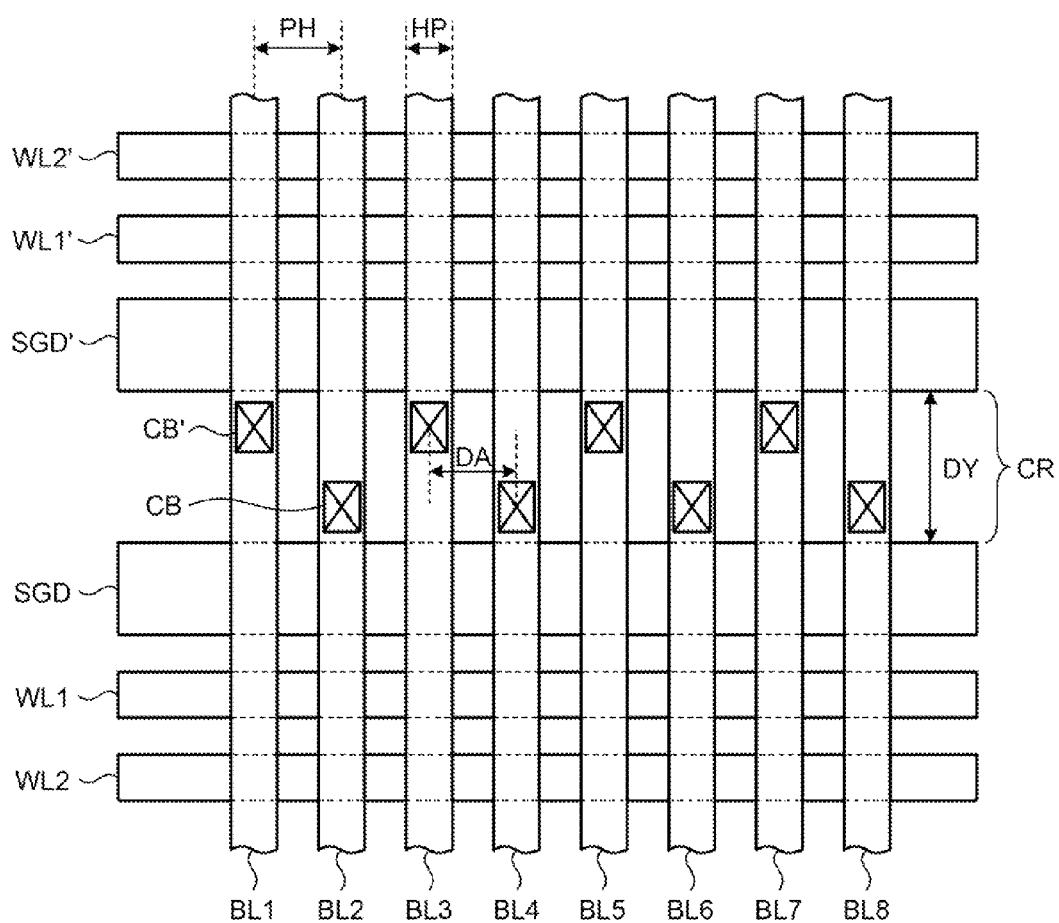
FIG. 1 is a plan view illustrating a schematic configuration of a contact region of a semiconductor device according to a first embodiment.

FIG. 1 is a plan view illustrating a schematic configuration of a contact region of a semiconductor device according to the first embodiment. A NAND flash memory is applied as an example of the semiconductor device.

In FIG. 1, bit lines BL1 to BL8 are arranged in parallel at a wiring pitch PH in an orthogonal direction with respect to a wiring direction thereof. The wiring pitch PH of the bit lines BL1 to BL8 can be made to correspond to a minimum pitch of a line and space in a semiconductor integrated circuit. This wiring pitch PH can satisfy the relationship PH<0.25*λ/NA, where λ is an exposure wavelength in lithography and NA is a numerical aperture in a projection optical system. Moreover, a width HP of each of the bit lines BL1 to BL8 can be made to correspond to ½ of a minimum pitch in a semiconductor integrated circuit.

The bit lines BL1 to BL8 are provided with a contact region CR and bit contacts CB and CB' are formed in the contact region CR. The bit contacts CB' are connected to odd-numbered bit lines among the bit lines BL1 to BL8 and the bit contacts CB are connected to even-numbered bit lines among the bit lines BL1 to BL8. The bit contacts CB' are arranged in parallel in an orthogonal direction with respect to the wiring direction of the bit lines BL1 to BL8 and the bit contacts CB are arranged in parallel in an orthogonal direction with respect to the wiring direction of the bit lines BL1 to BL8 in such a way as to be offset from the bit contacts CB' in the wiring direction of the bit lines BL1 to BL8. The bit contacts CB are offset from the bit contacts CB' by the wiring pitch PR in an orthogonal direction with respect to the wiring direction of the bit lines BL1 to BL8. In other words, an interval DA between the bit contacts CB and CB' in an orthogonal direction with respect to the wiring direction of the bit lines BL1 to BL8 is equal to the wiring pitch PH. At this time, the accuracy of the interval DA between the bit contacts CB and CB' is equal to the accuracy of the wiring pitch PH.

Moreover, word lines WL1, WL2, WL1', and WL2' and select gate lines SGD and SGD' are arranged in parallel in an orthogonal direction with respect to the wiring direction of the bit lines BL1 to BL8. The contact region CE is arranged between the select gate lines SGD and SGD'. The word lines WL1 and WL2 are arranged on the select gate line SGD side and the word lines WL1' and WL2' are arranged on the select gate line SGD' side.

The lower ends of the bit contacts CB and CB' can be connected to a high-concentration impurity diffusion layer formed between the select gate lines SGD and SGD' in active areas isolated from each other by a trench.

The bit contacts CB' are connected to odd-numbered bit lines among the bit lines BL1 to BL8, the bit contacts CB are connected to even-numbered bit lines among the bit lines BL1 to BL8, and the bit contacts CB are arranged offset from the bit contacts CB' in the wiring direction of the bit lines BL1 to BL8, therefore, even when the wiring pitch PR of the bit lines BL1 to BL8 corresponds to a minimum pitch by optical lithography, a short circuit between the bit contacts CB and CB' can be prevented while suppressing an increase in a width DY of the contact region CR.

(Second Embodiment)

FIG. 2A to FIG. 2E are plan views illustrating a manufacturing method of a contact region of a semiconductor device according to the second embodiment.

Figure 2A:
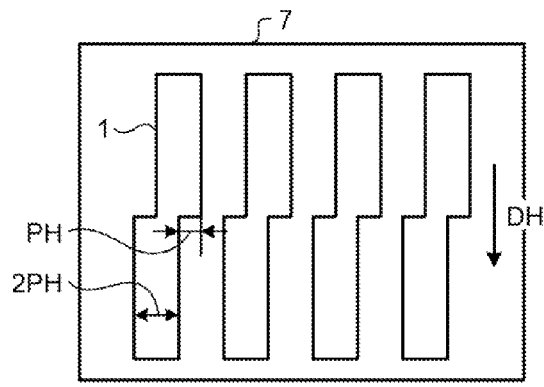
FIG. 2A to FIG. 2E are plan views illustrating a manufacturing method of a contact region of a semiconductor device according to a second embodiment.

In FIG. 2A, mask patterns 1 are formed on a reticle 7. A plurality of the mask patterns 1 having a linear shape is formed in parallel in an orthogonal direction with respect to a wiring direction DH in such a way as to be offset in the middle by the wiring pitch PH in an orthogonal direction with respect to the wiring direction DH. The wiring pitch PH can be made to correspond to a minimum pitch of a line and space in a semiconductor integrated circuit. This wiring pitch PH can satisfy the relationship PH<0.25*λ/NA, where λ is an exposure wavelength in lithography and MA is a numerical aperture in a projection optical system. At this time, the width of the mask pattern 1 can be set to 2 PH. Moreover, the interval between the mask patterns 1 can be set to 2 PH.

Figure 2B:
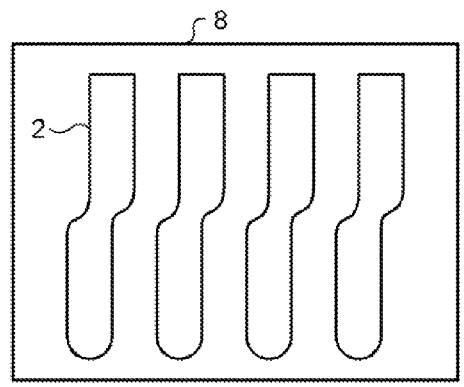

Then, as shown in FIG. 2B, core patterns 2 onto which the mask patterns 1 are transferred are formed on a processing target layer 8 by using a method such as ArF immersion exposure. A resist material or a hard mask material, such as a BSG film and a silicon nitride film, may be used as the material for the core patterns 2. The processing target layer 8 may be a semiconductor substrate, a dielectric layer formed on the semiconductor substrate, or the like, and is not specifically limited.

Figure 2C:
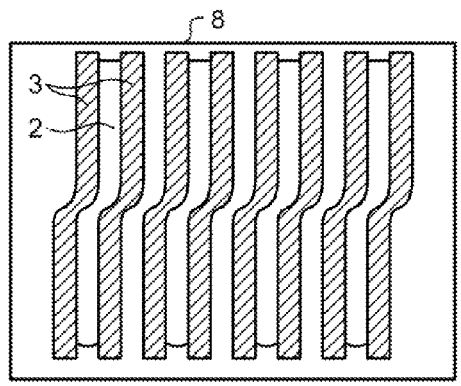

Next, as shown in FIG. 2C, the core patterns 2 are slimmed by a method, such as isotropic etching, to thin the line width of the core patterns 2. Then, for example, a sidewall material having a high selectivity with respect to the core patterns 2 is deposited on the whole surface of the processing target layer 8 including the sidewalls of the core patterns 2 by a method, such as the CVD. As the sidewall material having a high selectivity with respect to the core patterns 2, for example, when the core pattern 2 is formed of a BSG film, a silicon nitride film can be used. Then, the processing target layer 8 is exposed while leaving the sidewall material on the sidewalls of the core patterns 2 by perforating anisotropic etching on the sidewall material, thereby forming sidewall patterns 3 on the sidewalls of the core patterns 2. At this time, the sidewall pattern 3 is offset in the middle by the wiring pitch PH in an orthogonal direction with respect to the wiring direction DH.

Figure 2D:
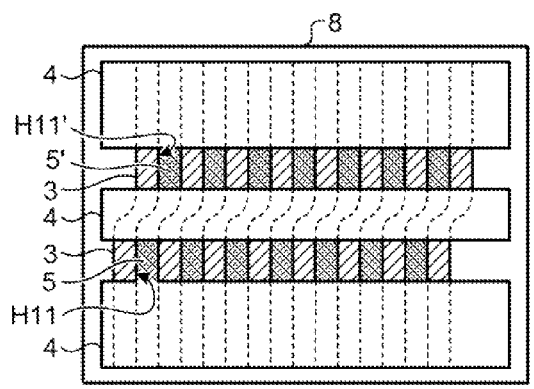

Next, as shown in FIG. 2D, the core patterns 2 are removed from over the processing target layer 8 while leaving the sidewall patterns 3 on the processing target layer 8. Next, mask patterns 4 that cover part of the spaces between the sidewall patterns 3 are formed on the processing target layer 8 by using the photolithography technology and the etching technology, thereby forming openings H11 and H11' surrounded by the sidewall patterns 3 and the mask patterns 4. At this time, the openings H11 and H11' can be arranged in two rows in an orthogonal direction with respect to the wiring direction DH. Moreover, the openings H11' of the first row are offset from the openings H11 of the second row by the wiring pitch PH in an orthogonal direction with respect to the wiring direction DH. A resist material or a hard mask material, such as a BSG film and a silicon nitride film, may be used as the material for the mask patterns 4.

Then, openings 5 and 5' formed by transferring the openings H11 and H11' are formed in the processing target layer 8 by etching the processing target layer 8 via the openings H11 and H11'. At this time, the openings 5 and 5'can be arranged in two rows in an orthogonal direction with respect to the wiring direction DH. Moreover, the openings 5' of the first row are offset from the openings 5 of the second row by the wiring pitch PH in an orthogonal direction with respect to the wiring direction DH.

Figure 2E:
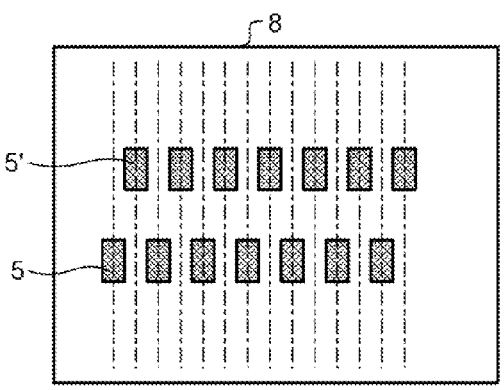

Then, as shown in FIG. 2E, the sidewall patterns 3 and the mask patterns 4 are removed from over the processing target layer 8 in which the openings 5 and 5' are formed. Thus, wires arranged in parallel at the wiring pitch PH in an orthogonal direction with respect to the wiring direction DH can be formed on the openings 5 and 5' along the wiring direction DH. The width of the wires can be set to ½ of the wiring pitch PH.

The openings 5 and 5' are formed in the regions partitioned by the sidewall patterns 3, therefore, even when the wiring pitch PH is set equal to or less than the resolution of the lithography, the contacts can be formed in the wires by arranging the openings 5 and 5' in two rows.

(Third Embodiment)

Figure 13A:
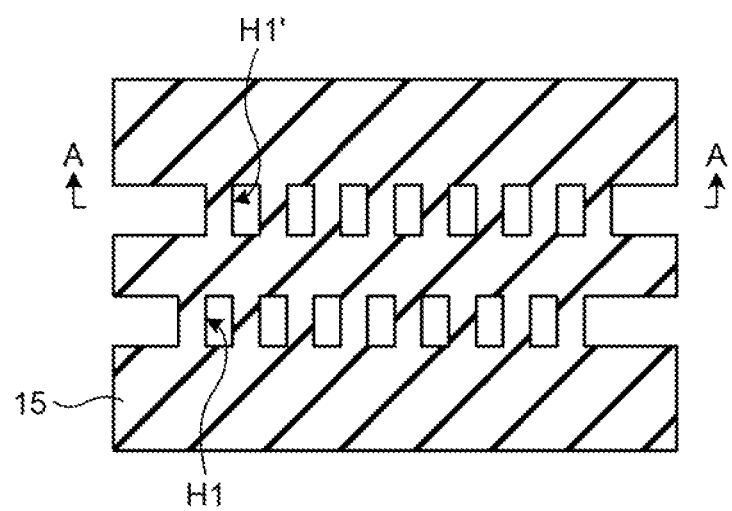
FIG. 13A is a plan view illustrating the manufacturing method of the contact region of the semiconductor device according to the third embodiment and FIG. 13B is a cross-sectional view cut along line A-A in FIG. 13A.
Figure 13B:
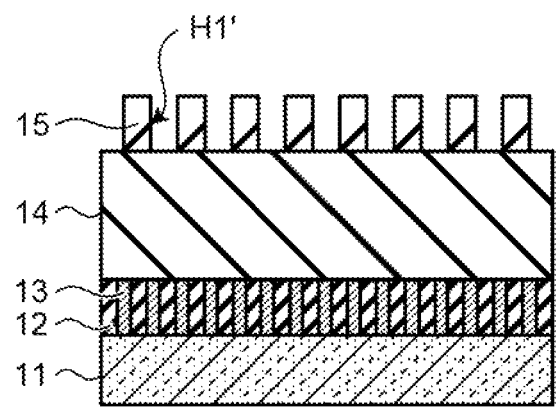
Figure 14A:
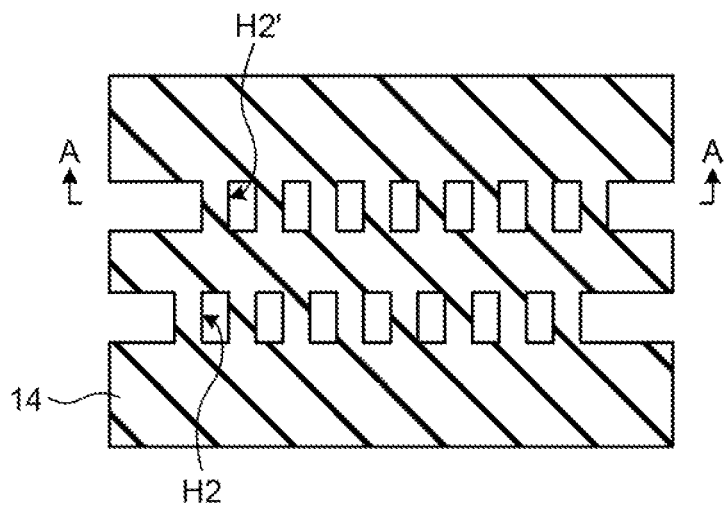
FIG. 14A is a plan view illustrating the manufacturing method of the contact region of the semiconductor device according to the third embodiment.
Figure 14B:
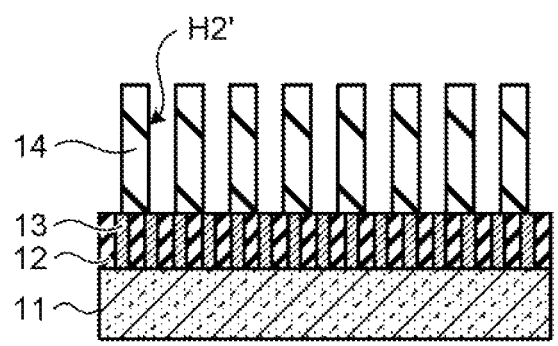
FIG. 14B is a cross-sectional view cut along line A-A in FIG. 14A when contact holes are vertically processed.
Figure 14C:
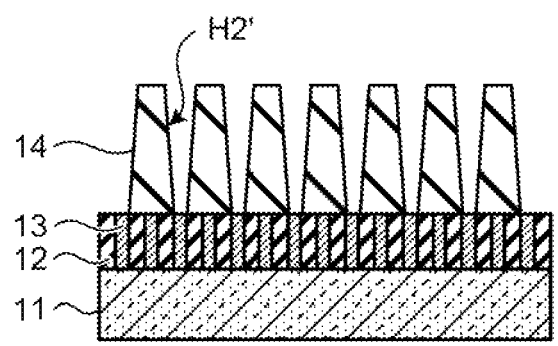
FIG. 14C is a cross-sectional view cut along line A-A in FIG. 14A when contact holes are tapered.

FIG. 3A to FIG. 14A are plan views illustrating a manufacturing method of a contact region of a semiconductor device according to the third embodiment, and FIG. 3B to FIG. 13B are cross-sectional views cut along line A-A in FIG. 3A to FIG. 13A, respectively, FIG. 14B is a cross-sectional view cut along line A-A in FIG. 14A when contact holes are vertically processed, and FIG. 14C is a cross-sectional view cut along line A-A in FIG. 14A when contact holes are tapered.

Figure 3A:
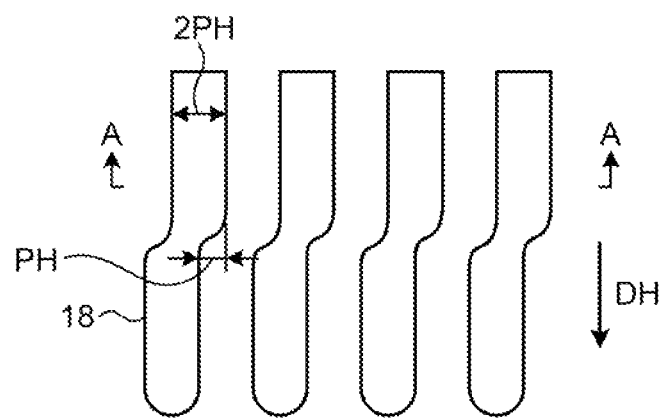
FIG. 3A is a plan view illustrating a manufacturing method of a contact region of a semiconductor device according to a third embodiment and FIG. 3B is a cross-sectional view cut along line A-A in FIG. 3A.
Figure 3B:
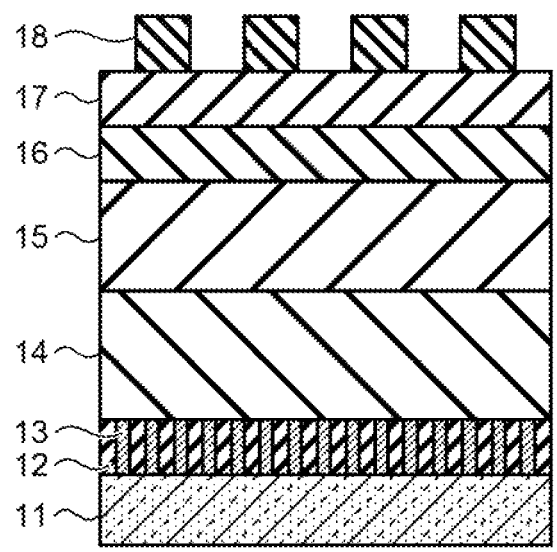

In FIG. 3A and FIG. 3B, an interlayer dielectric film 12 is formed on an underlying layer 11 and lower layer wires 13 are embedded in the interlayer dielectric film 12. The underlying layer 11 may be a semiconductor substrate, a dielectric layer formed on the semiconductor substrate, or the like, and is not specifically limited. An interlayer dielectric film 14 is formed on the lower layer wires 13 and mask layers 15 and 16 and a core layer 17 are sequentially stacked on the interlayer dielectric film 14. Moreover, the lower layer wires 13 may be active areas isolated by a trench in a NAND flash memory.

Then, mask patterns 18 are formed on the core layer 17 by using a method such as ArF immersion exposure. A plurality of the mask patterns 18 having a linear shape is formed in parallel in an orthogonal direction with respect to the wiring direction OH in such a way as to be offset in the middle by the wiring pitch PH in an orthogonal direction with respect to the wiring direction DH. A resist material can be used as the material for the mask patterns 18.

Figure 4A:
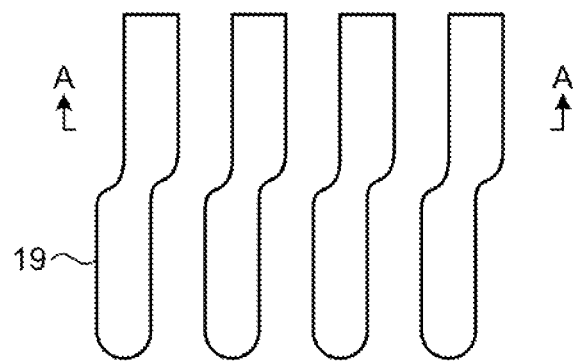
FIG. 4A is a plan view illustrating the manufacturing method of the contact region of the semiconductor device according to the third embodiment and FIG. 4B is a cross-sectional view cut along line A-A in FIG. 1A.
Figure 4B:
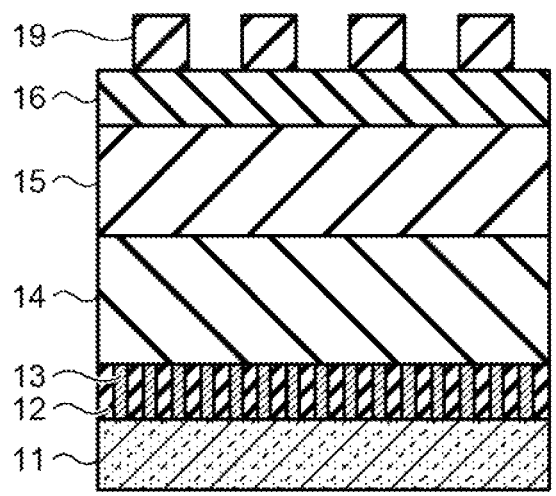

Next, as shown in FIG. 4A and FIG. 4B, core patterns 19 onto which the mask patterns 18 are transferred are formed on the mask layer 16 by etching the core layer 17 with the mask patterns 18 as a mask. A hard mask material, such as a BSG film and a silicon nitride film, can be used as the material for the core patterns 19.

Figure 5A:
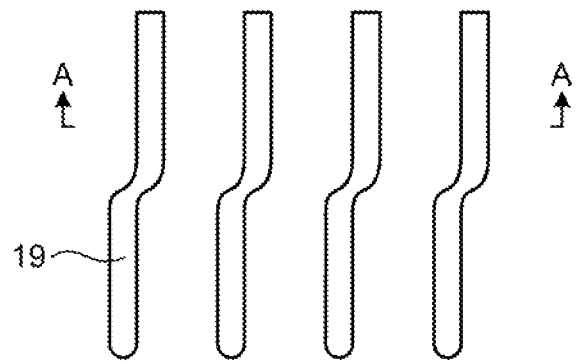
FIG. 5A is a plan view illustrating the manufacturing method of the contact region of the semiconductor device according to the third embodiment and FIG. 5B is a cross-sectional view cut along line A-A in FIG. 5A.
Figure 5B:
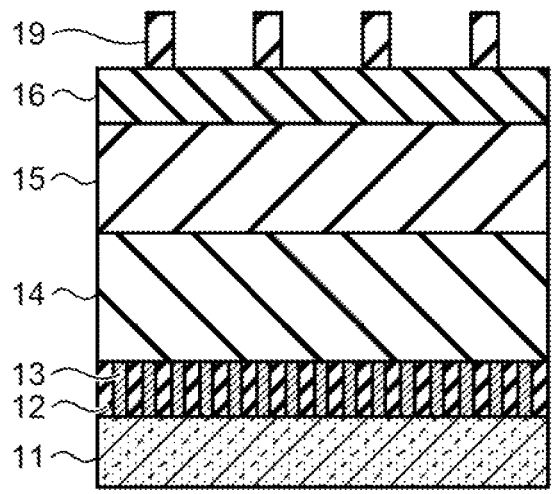

Next, as shown in FIG. 5A and FIG. 5B, the core patterns 19 are slimmed by a method, such as isotropic etching, to thin the line width of the core patterns 19.

Next, as shown in FIG. 6A and FIG. 6B, for example, a sidewall material 20 having a high selectivity with respect to the core patterns 19 is deposited on the whole surface of the mask layer 16 including the sidewalls of the core patterns 19 by a method, such as the CVD. As the sidewall material 20 having a high selectivity with respect to the core patterns 19, for example, when the core pattern 19 is formed of a BSG film, a silicon nitride film can be used.

Figure 7A:
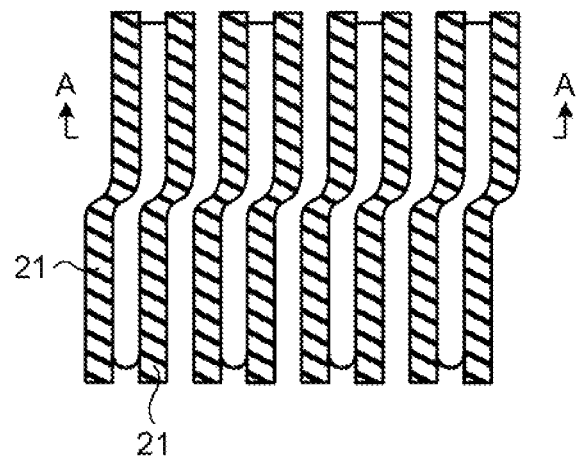
FIG. 7A is a plan view illustrating the manufacturing method of the contact region of the semiconductor device according to the third embodiment and FIG. 7B is a cross-sectional view cut along line A-A.
Figure 7B:
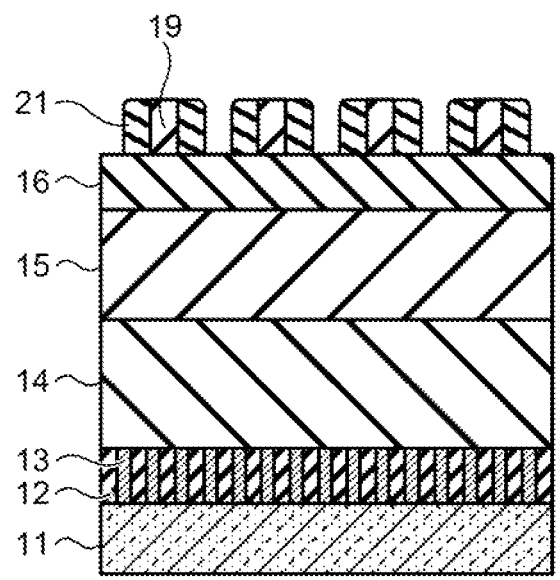

Next, as shown in FIG. 7A and FIG. 7B, the mask layer 16 is exposed while leaving the sidewall material 20 on the sidewalls of the core patterns 19 by performing anisotropic etching on the sidewall material 20, thereby forming sidewall patterns 21 on the sidewalls of the core patterns 19. At this time, the sidewall pattern 21 is offset in the middle by the wiring pitch PH in an orthogonal direction with respect to the wiring direction DH.

Figure 8A:
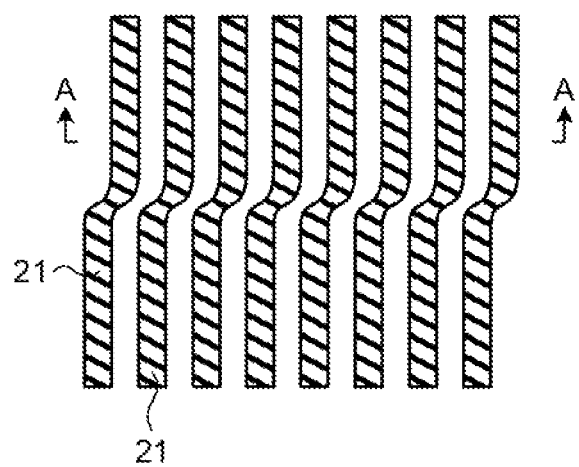
FIG. 8A is a plan view illustrating the manufacturing method of the contact region of the semiconductor device according to the third embodiment and FIG. 8B is a cross-sectional view cut along line A-A in FIG. 8A.
Figure 8B:
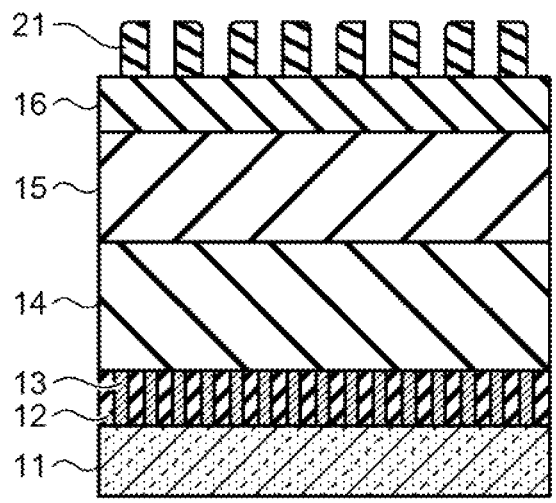

Next, as shown in FIG. 8A and FIG. 8B, the core patterns 19 are removed from over the mask layer 16 while leaving the sidewall patterns 21 on the mask layer 16.

Figure 9A:
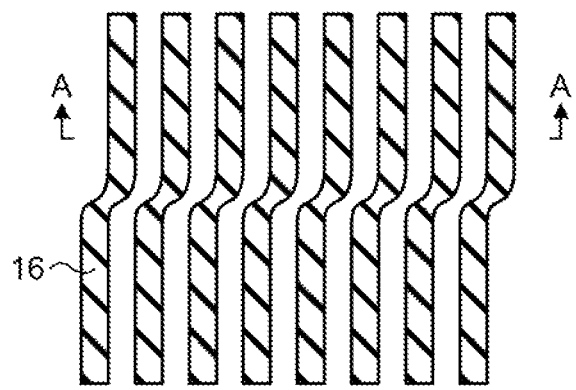
FIG. 9A is a plan view illustrating the manufacturing method of the contact region of the semiconductor device according to the third embodiment and FIG. 9B is a cross-sectional view cut along line A-A in FIG. 9A.
Figure 9B:
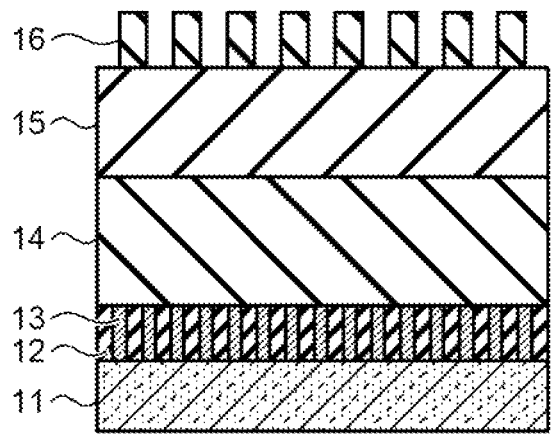

Next, as shown in FIG. 9A and FIG. 9B, the sidewall patterns 21 are transferred onto the mask layer 16 by etching the mask layer 16 with the sidewall patterns 21 as a mask. A material having a low selectivity with respect to the sidewall patterns 21 can be used as the material for the mask layer 16. For example, when the sidewall pattern 21 is formed of a silicon nitride film, a BSG film can be used as the mask layer 16.

Figure 10A:
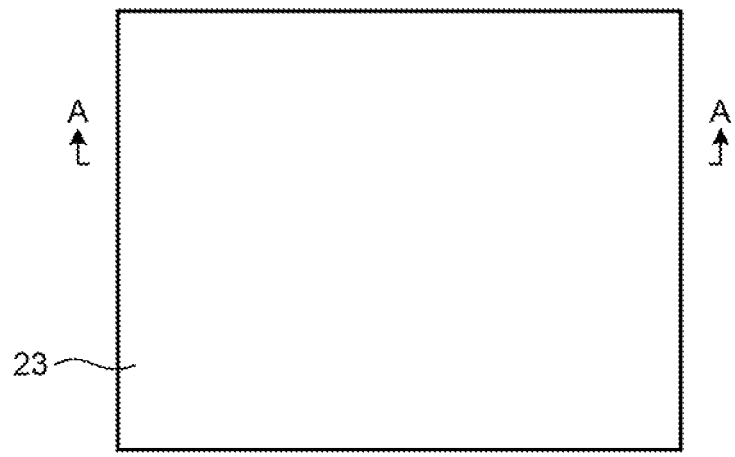
FIG. 10A is a plan view illustrating the manufacturing method of the contact region of the semiconductor device according to the third embodiment and FIG. 10B is a cross-sectional view cut along line A-A in FIG. 10A.
Figure 10B:
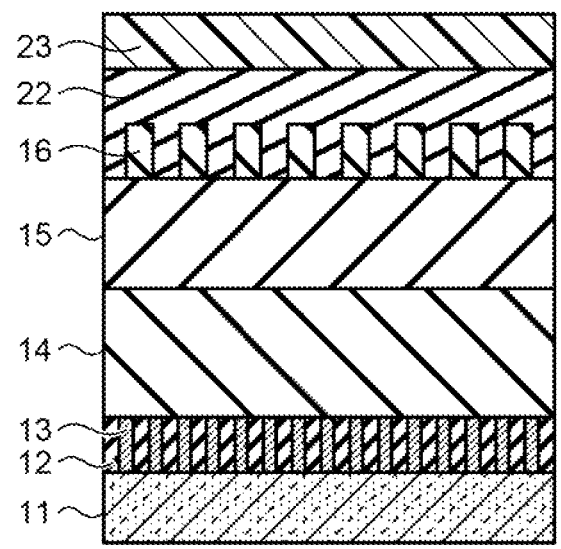

Next, as shown in FIG. 10A and FIG. 10B, a mask layer 22 is formed on the mask layer 15 in such a way that the mask layer 16 onto which the sidewall patterns 21 are transferred is embedded. Furthermore, a mask layer 23 is formed on the mask layer 22. A material having a low selectivity with respect to the mask layer 16 and the mask layer 22 can be used as the material for the mask layer 15. Moreover, a material having a low selectivity with respect to the mask layer 16 can be used as the material for the mask layer 22. For example, when the mask layer 16 is formed of a BSG film, a polycrystalline silicon, film can be used as the mask layer 22 and a silicon nitride film can be used as the mask layer 15. Moreover, a resist material, can be used as the material for the mask layer 23.

Figure 11A:
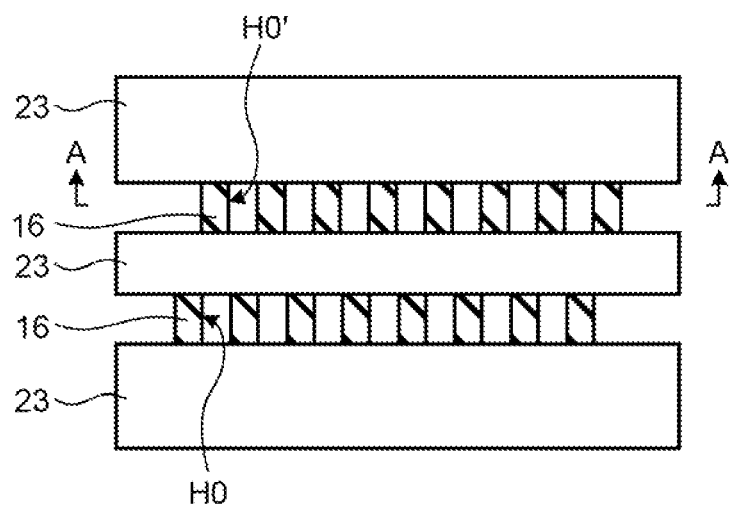
FIG. 11A is a plan view illustrating the manufacturing method of the contact region of the semiconductor device according to the third embodiment and FIG. 11B is a cross-sectional view cut along line A-A in FIG. 11A.
Figure 11B:
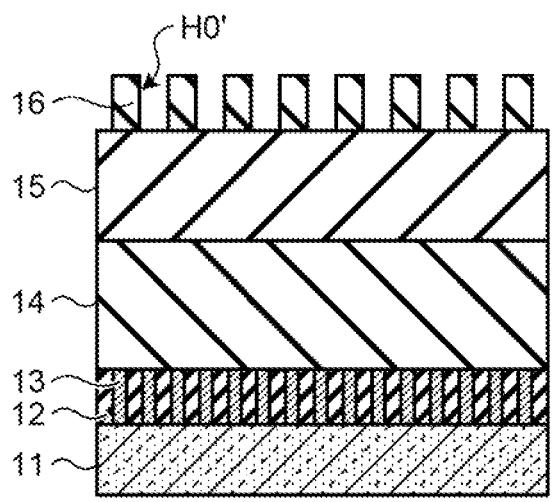

Next, as shown in FIG. 11A and FIG. 11B, the mask layer 23 is patterned in such a way as to expose regions between a stepped portion and both end portions of the mask, layer 16 onto which the sidewall patterns 21 are transferred by using the photolithography technology. Then, the mask layer 22 between the mask layers 16 exposed from the mask layer 23 is removed by etching the mask layer 22 via the patterned mask layer 23, thereby forming openings H0 and H0' surrounded by the patterned mask layers 16 and 22. At this time, the openings H0' are arranged in parallel in the first row in an orthogonal direction with respect to the wiring direction DH and the openings H0 are arranged in parallel in the second row in an orthogonal direction with respect to the wiring direction DH. Moreover, the openings H0' of the first row are offset from the openings H0 of the second row by the wiring pitch PH in an orthogonal direction with respect to the wiring direction DH.

Figure 12A:
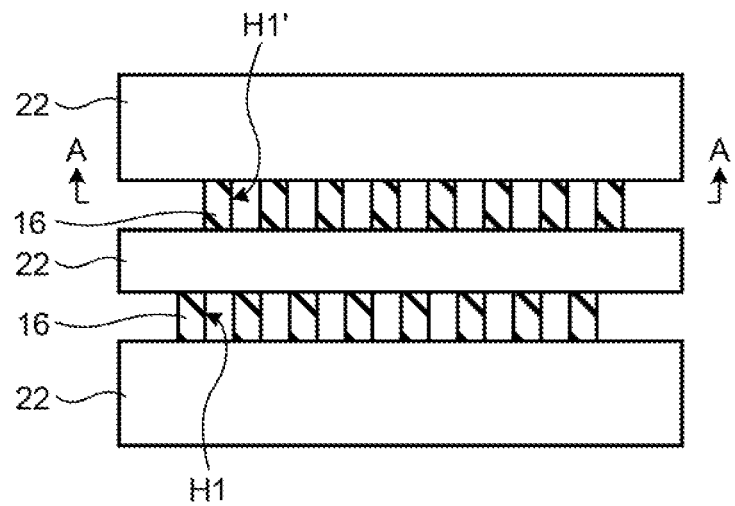
FIG. 12A is a plan view illustrating the manufacturing method of the contact region of the semiconductor device according to the third embodiment and FIG. 12B is a cross-sectional view cut along line A-A in FIG. 12A.
Figure 12B:
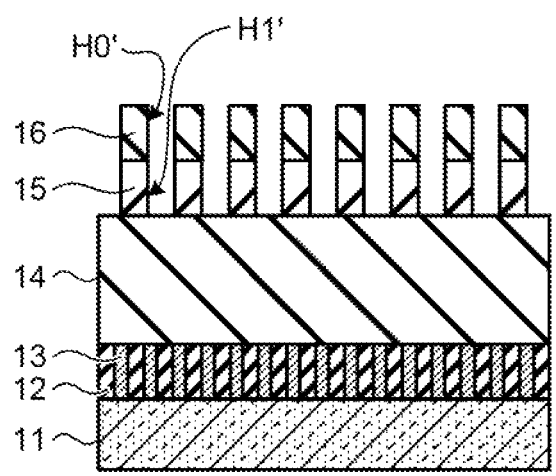

Next, as shown in FIG. 12A and FIG. 12B, after removing the mask layer 23, the openings H0 and H0' are transferred onto the mask layer 15 by etching the mask layer 15 via the openings H0 and H0' surrounded by the mask layers 16 and 22, thereby forming the openings H1 and H1' in the mask layer 15.

Next, as shown in FIG. 13A and FIG. 13B, the mask layers 16 and 22 are removed from over the mask layer 15 in which the openings H1 and H1' are formed.

Next, as shown in FIG. 14A and FIG. 14B, the openings H1 and H1' are transferred onto the interlayer dielectric film 14 by etching the interlayer dielectric film 14 via the openings H1 and H1' formed in the mask layer 15, thereby forming openings H2 and H2' in the interlayer dielectric film 14. At this time, the surfaces of the lower layer wires 13 are exposed via the openings H2 and H2'. A material having a low selectivity with respect to the mask layer 15 can be used as the material for the interlayer dielectric film 14. For example, when the mask layer 15 is formed of a silicon nitride film, a silicon oxide film can be used as the interlayer dielectric film 14.

When etching the interlayer dielectric film 14 via the openings H1 and H1', the bottom portions of the openings H2 and H2' may be thinned as shown in FIG. 14C by tapering the interlayer dielectric film 14. At this time, the width of the bottom portions of the openings H2 and H2' can be made equal to the width of the lower layer wires 13.

(Fourth Embodiment)

Figure 15A:
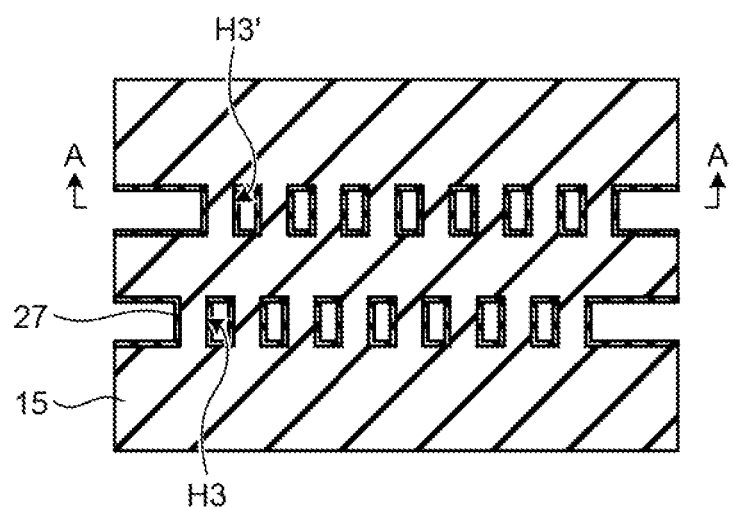
FIG. 15A is a plan view illustrating a manufacturing method of a contact region of a semiconductor device according to a fourth embodiment and FIG. 15B is a cross-sectional view cut along line A-A in FIG. 15A.
Figure 15B:
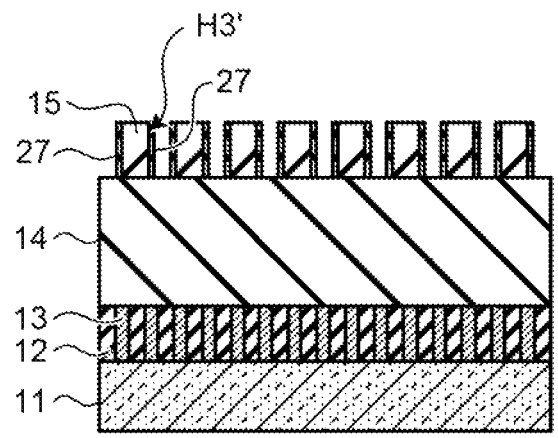
Figure 16A:
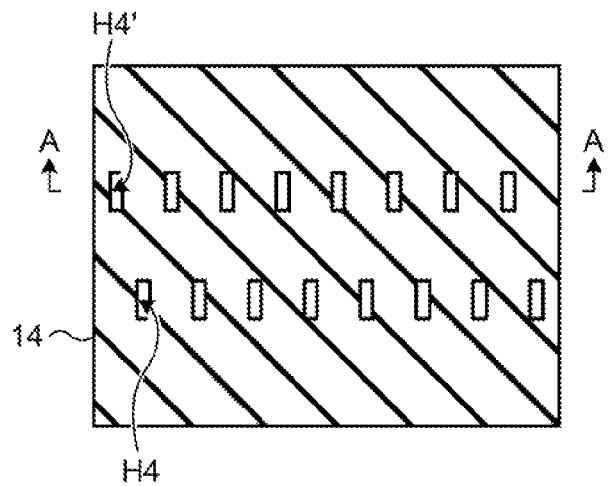
FIG. 16A is a plan view illustrating a manufacturing method of the contact region of the semiconductor device according to the fourth embodiment.
Figure 16B:
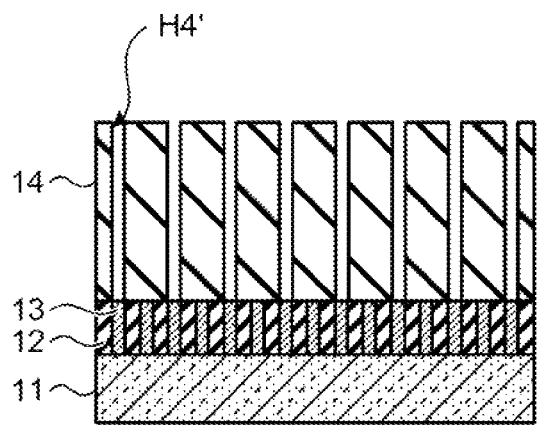
FIG. 16B is a cross-sectional view cut along line A-A in FIG. 16A.
Figure 16C:
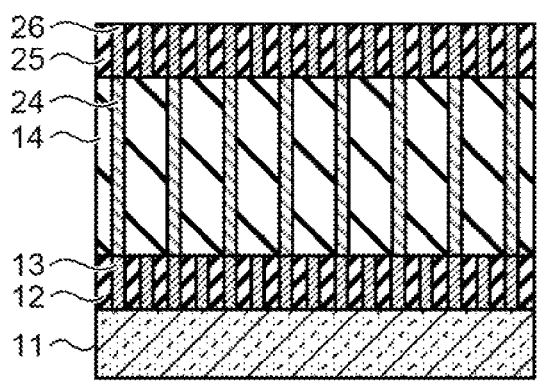
FIG. 16C is a cross-sectional view illustrating a configuration in which upper layer wires are formed on contacts in FIG. 16B.

FIG. 15A and FIG. 16A axe plan views illustrating a manufacturing method of a contact region of a semiconductor device according to the fourth embodiment, FIG. 15B and FIG. 16B are cross-sectional views cut along line A-A in FIG. 15A and FIG. 16A, respectively, and FIG. 16C is a cross-sectional view illustrating a configuration in which upper layer wires are formed on contacts in FIG. 16B.

In FIG. 15A, after the processes in FIG. 13A and FIG. 13B, sidewall patterns 27 are formed on the sidewalls of the openings H1 and H1' to form openings H3 and H3' surrounded by the sidewall patterns 27.

Next, as shown in FIG. 16A and FIG. 16B, the openings H3 and H3 are transferred onto the interlayer dielectric film 14 by etching the interlayer dielectric film 14 via the openings H3 and H3 surrounded by the sidewall patterns 27, thereby forming openings H4 and H4' in the interlayer dielectric film 14. At this time, the width of the openings H4 and H4' can be made equal to the width of the lower layer wires 13.

Next, as shown in FIG. 16C, after embedding a contact material 24 in the openings H4 and H4', an interlayer dielectric film 25 is formed on the interlayer dielectric film 14. As the contact material 24, for example, conductor, such as Al and Cu, can be used. Then, upper layer wires 26 connected to the lower layer wires 13 via the contact material 24 are embedded in the interlayer dielectric film 25.

In the above embodiment, the method is explained in which the sidewall patterns 27 are formed on the sidewalls of the openings H1 and H1' for forming the openings H4 and H4', however, the openings H4 and H4' having a width smaller than the openings H1 and H1' may be formed by adjusting the processing conditions.

(Fifth Embodiment)

FIG. 17A to FIG. 17F are plan views illustrating a manufacturing method of a contact region of a semiconductor device according to the fifth embodiment.

Figure 17A:
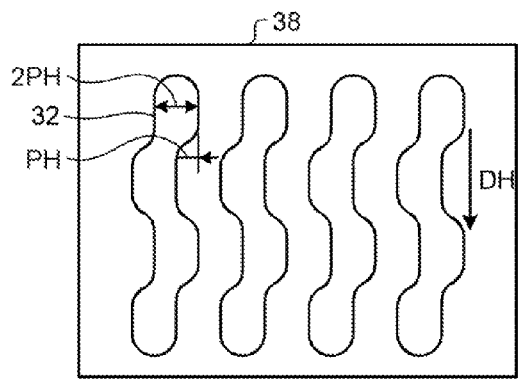
FIG. 17A to FIG. 17F are plan views illustrating a manufacturing method of a contact region of a semiconductor device according to a fifth embodiment.

In FIG. 17A, core patterns 32 are formed on a processing target layer 38 by using a method such as ArF immersion exposure. A plurality of the core patterns 32 having a linear shape is formed in parallel in an orthogonal direction with respect to the wiring direction DH in such a way as to be offset back and forth in three stages by the wiring pitch PH in an orthogonal direction with respect to the wiring direction DH. The wiring pitch PH can be made to correspond to a minimum pitch of a line and space in a semiconductor integrated circuit. At this time, the width of the core patterns 32 can be set to 2 PH. Moreover, the interval between the core patterns 32 can be set to 2PH. A resist material or a hard mask material, such as a BSG film and a silicon nitride film, may be used as the material for the core patterns 32. The processing target layer 38 may be a semiconductor substrate, a dielectric layer formed on the semiconductor substrate, or the like, and is not specifically limited.

Figure 17B:
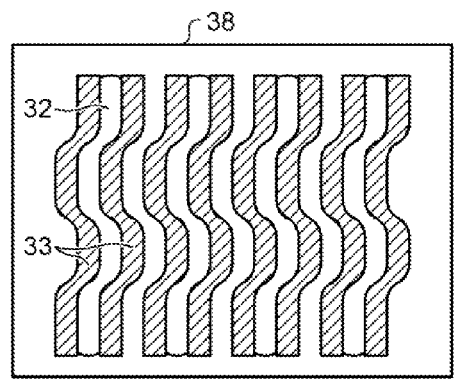

Next, as shown in FIG. 17B, the core patterns 32 are slimmed by a method, such as isotropic etching, to thin the line width of the core patterns 32. Then, sidewall patterns 33 are formed on the sidewalls of the core pattern 32. At this time, the sidewall pattern 33 has an internal offset by the amount of the wiring pitch PH in an orthogonal direction with respect to the wiring direction DH.

Figure 17C:
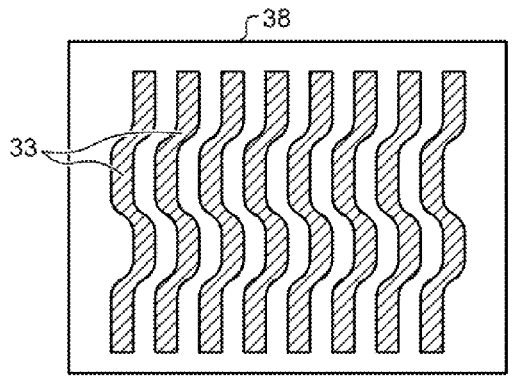

Next, as shown in FIG. 17C, the core patterns 32 are removed from over the processing target layer 38 while leaving the sidewall patterns 33 on the processing target layer 38.

Figure 17D:
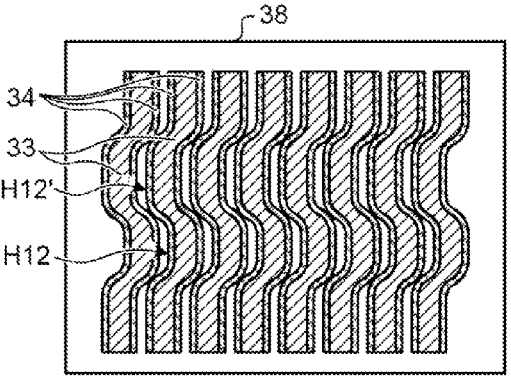

Next, as shown in FIG. 17D, for example, a sidewall material is deposited on the whole surface of the processing target layer 38 including the sidewalls of the sidewall patterns 33 by a method, such as the CVD. Then, the processing target layer 38 is exposed while leaving the sidewall material on the sidewalls of the sidewall patterns 33 by performing anisotropic etching on the sidewall material, thereby forming sidewall patterns 34 on the sidewalls of the sidewall patterns 33. At this time, the sidewall pattern 34 has an internal offset by the amount of the wiring pitch PH in an orthogonal direction with respect to the wiring direction DH. Then, the sidewall patterns 34 facing each other with a space therebetween are brought into contact with each other at the stepped portions thereof, thereby forming openings H12 and H12' surrounded by the sidewall patterns 34. At this time, the openings H12 and H12' can be arranged in two rows in an orthogonal direction with respect to the wiring direction DH. Moreover, the openings H12' of the first row are offset from the openings H12 of the second row by the wiring pitch PH in an orthogonal direction with respect to the wiring direction DH. The material of the sidewall patterns 34 may be the same as or different from the material of the sidewall patterns 33.

Figure 17E:
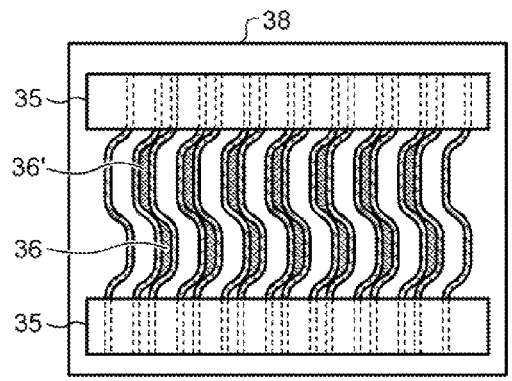

Next, as shown in FIG. 17E, mask patterns 35 that cover the spaces of both end portions of the sidewall patterns 34 are formed on the processing target layer 38 by using the photolithography technology and the etching technology. A resist material or a hard mask material, such as a BSG film and a silicon nitride film, may be used as the material for the mask patterns 35.

Then, openings 36 and 36' formed by transferring the openings H12 and H12' are formed in the processing target layer 38 by etching the processing target layer 38 via the openings B12 and B12'. At this time, the openings 36 and 36' can be arranged in two rows in an orthogonal direction with respect to the wiring direction DH. Moreover, the openings 36' of the first row are offset from the openings 36 of the second row by the wiring pitch PH in an orthogonal direction with respect to the wiring direction DH.

Figure 17F:
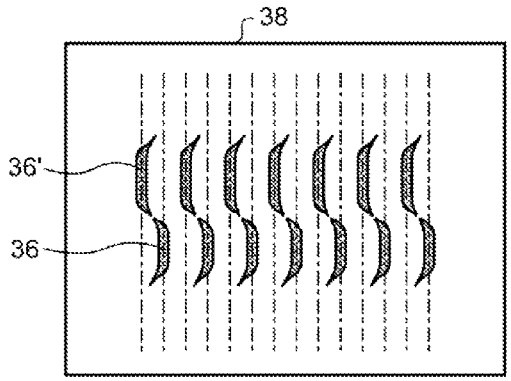

Then, as shown in FIG. 17F, the sidewall patterns 33 and 34 and the mask patterns 35 are removed from over the processing target layer 38 in which the openings 36 and 36' are formed. Thus, wires arranged in parallel at the wiring pitch PH in an orthogonal direction with respect to the wiring direction DH can foe formed on the openings 36 and 36' along the wiring direction DH. The width of the wires can be set to ½ of the wiring pitch PH.

The openings H12 and H12' partitioned by the sidewall patterns 33 and 34 are formed, therefore, the layout of the openings 36 and 36' can be set without depending on the positioning accuracy in photolithography. Thus, even when the wiring pitch PH is set equal to or less than the resolution of the lithography, the contacts can be formed in the wires while suppressing an increase in area of the contact region.

(Sixth Embodiment)

FIG. 18A to FIG. 18F are plan views illustrating a manufacturing method of a contact region of a semiconductor device according to the sixth embodiment.

Figure 18A:
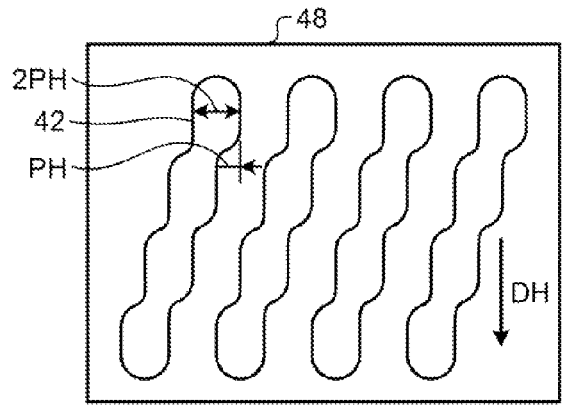
FIG. 18A to FIG. 18F are plan views illustrating a manufacturing method, of a contact region of a semiconductor device according to a sixth embodiment.

In FIG. 18A, core patterns 42 are formed on a processing target layer 48 by using a method such as ArF immersion exposure. A plurality of the core patterns 42 having a linear shape is formed in parallel in an orthogonal direction with respect to the wiring direction DH in such a way as to be offset in a stepwise manner in three stages by the wiring pitch PH in an orthogonal direction with respect to the wiring direction DH. The wiring pitch PH can be made to correspond to a minimum pitch of a line and space in a semiconductor integrated circuit. At this time, the width of the core pattern 42 can be set to 2 PH. Moreover, the interval between the core patterns 42 can be set to 2 PH. A resist material or a hard mask material, such as a BSG film and a silicon nitride film, may be used as the material for the core patterns 42, The processing target layer 48 may be a semiconductor substrate, a dielectric layer formed on the semiconductor substrate, or the like, and is not specifically limited.

Figure 18B:
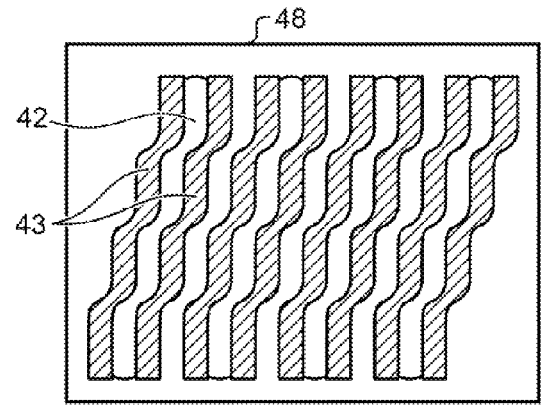

Next, as shown in FIG. 18B, the core patterns 42 are slimmed by a method, such as isotropic etching, to thin the line width of the core patterns 42. Then, sidewall patterns 43 are formed on the sidewalls of the core patterns 42. At this time, the sidewall pattern 43 has an internal offset by the amount of the wiring pitch PH in an orthogonal direction with respect to the wiring direction DH.

Figure 18C:
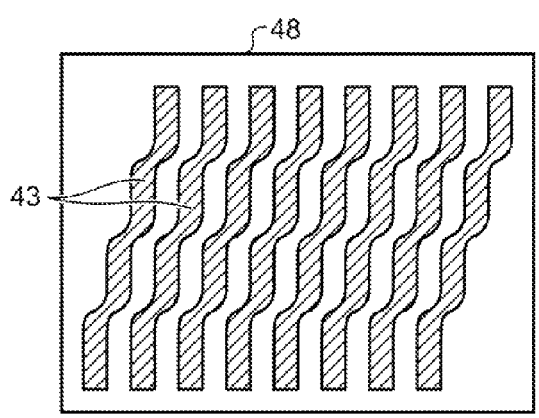

Next, as shown in FIG. 18C, the core patterns 42 are removed from over the processing target layer 48 while leaving the sidewall patterns 43 on the processing target layer 48.

Figure 18D:
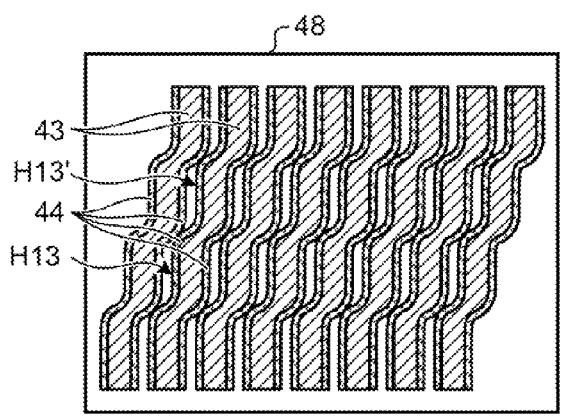

Next, as shown in FIG. 18D, sidewall patterns 44 are formed on the sidewalls of the sidewall patterns 43. At this time, the sidewall pattern 44 has an internal offset by the amount of the wiring pitch PH in an orthogonal direction with respect to the wiring direction DH. Then, the sidewall patterns 44 facing each other with a space therebetween are brought into contact with each other at the stepped portions thereof, thereby forming openings H13 and H13' surrounded by the sidewall patterns 44. At this time, the openings H13 and H13' can be arranged in two rows in an orthogonal direction with respect to the wiring direction DH. Moreover, the openings H13' of the first row are offset from the openings H13 of the second row by the wiring pitch PH in an orthogonal direction with respect to the wiring direction DH. The material of the sidewall patterns 44 may be the same as or different from the material of the sidewall patterns 43.

Figure 18E:
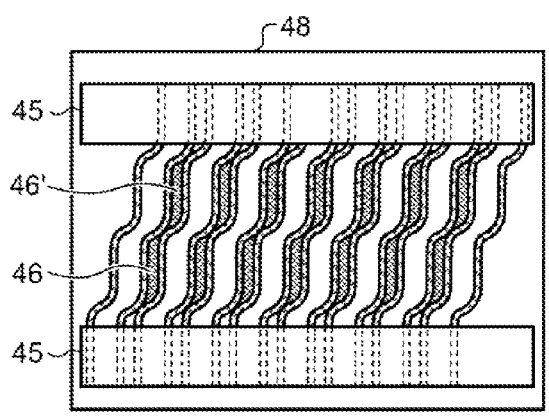

Next, as shown in FIG. 18E, mask patterns 45 that cover part of the spaces of both end portions of the sidewall patterns 44 are formed on the processing target layer 48 by using the photolithography technology and the etching technology. A resist material or a hard mask material, such as a BSG film and a silicon nitride film, may be used as the material for the mask patterns 45. Then, openings 46 and 46' formed by transferring the openings H13 and H13' are formed in the processing target, layer 48 by etching the processing target layer 48 via the openings H13 and H13'.

Figure 18F:
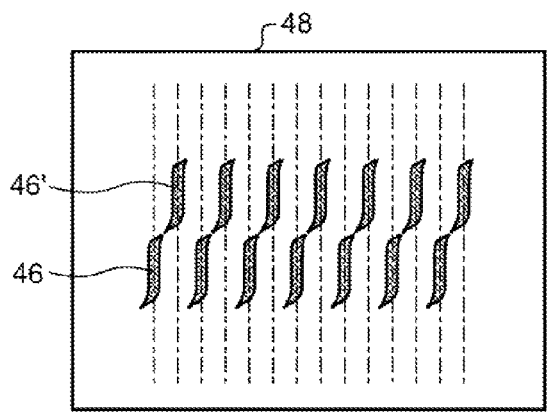

Then, as shown in FIG. 18F, the sidewall patterns 43 and 44 and the mask patterns 45 are removed from over the processing target layer 48 in which the openings 46 and 46' are formed.

The openings H13 and H13' partitioned by the sidewall patterns 43 and 44 are formed, therefore, the layout of the openings 46 and 46' can be set without depending on the positioning accuracy in photolithography. Thus, even when the wiring pitch PH is set equal to or less than the resolution of the lithography, the contacts can be formed in the wires while suppressing an increase in area of the contact region.

(Seventh Embodiment)

FIG. 19A to FIG. 19D and FIG. 20A to FIG. 20D are plan views illustrating a manufacturing method of a contact region of a semiconductor device according to the seventh embodiment.

Figure 19A:
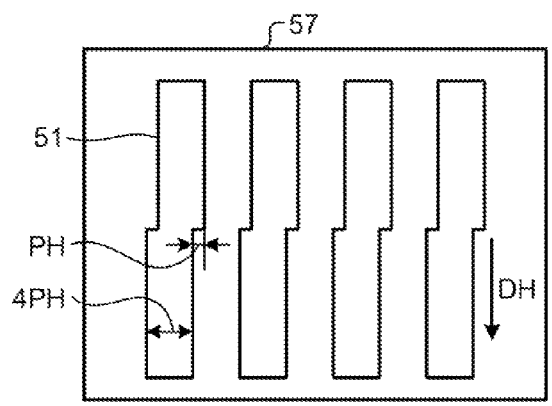
FIG. 19A to FIG. 19D are plan views illustrating a manufacturing method of a contact region of a semiconductor device according to a seventh embodiment.

In FIG. 19A, mask patterns 51 are formed, on a reticle 57. A plurality of the mask patterns 51 having a linear shape is formed in parallel in an orthogonal direction with respect to the wiring direction DH in such a way as to be offset in the middle by the wiring pitch PH in an orthogonal direction with respect to the wiring direction DH. The wiring pitch PH can be made to correspond to a minimum pitch of a line and space in a semiconductor integrated circuit. At this time, the width of the mask patterns 51 can be set to 4 PH. Moreover, the interval between the mask patterns 51 can be set to 4 PH.

Figure 19B:
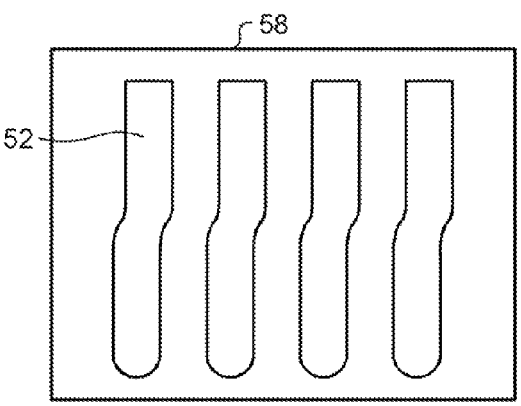

Then, as shown in FIG. 19B, core patterns 52 onto which the mask patterns 51 are transferred are formed on a processing target layer 58 by using a method such as ArF immersion exposure. A resist material or a hard mask material, such as a BSG film and a silicon nitride film, may be used as the material for the core patterns 52. The processing target layer 58 may be a semiconductor substrate, a dielectric layer formed on the semiconductor substrate, or the like, and is not specifically limited.

Figure 19C:
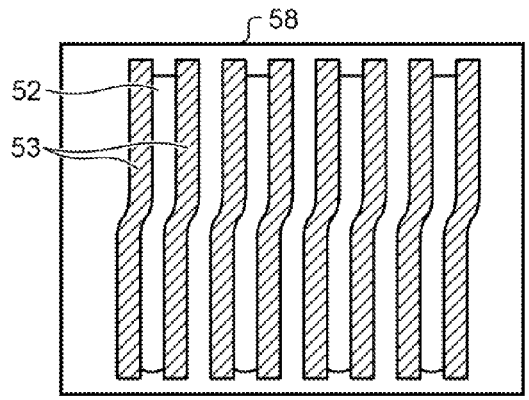

Next, as shown in FIG. 19C, the core patterns 52 are slimmed by a method, such as isotropic etching, to thin the line width of the core patterns 52. Then, sidewall patterns 53 are formed on the sidewalls of the core patterns 52. At this time, the sidewall pattern 53 is offset in the middle by the wiring pitch PH in an orthogonal direction with respect to the wiring direction DH. A material having a higher selectivity than the core patterns 52 can be selected as the material for the sidewall patterns 53. For example, when the core pattern 52 is formed of a BSG film, a silicon nitride film can be used as the sidewall patterns 53.

Figure 19D:
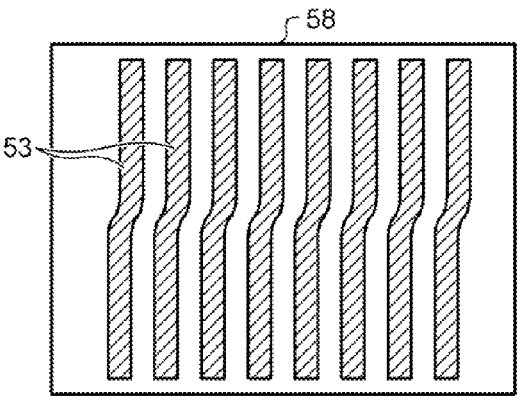

Next, as shown in FIG. 19D, the core patterns 52 are removed from over the processing target layer 58 while leaving the sidewall patterns 53 on the processing target layer 58.

Figure 20A:
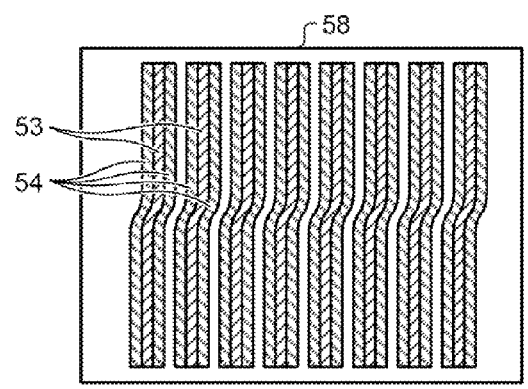
FIG. 20A to FIG. 20D are plan views illustrating the manufacturing method of the contact region of the semiconductor device according to the seventh embodiment.

Next, as shown in FIG. 20A, sidewall patterns 54 are formed on the sidewalls of the sidewall patterns 53. At this time, the sidewall pattern 54 is offset in the middle by the wiring pitch PH in an orthogonal direction wish respect to the wiring direction DH. A material having a higher selectivity than the sidewall patterns 53 can be selected as the material for the sidewall patterns 54. For example, when the sidewall pattern 53 is formed of a silicon nitride film, a polycrystalline silicon film can be used as the sidewall pattern 54.

Figure 20B:
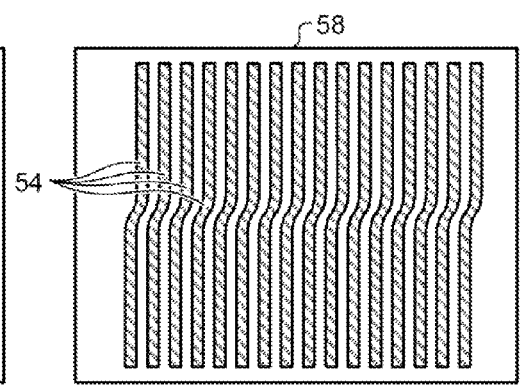

Next, as shown in FIG. 20B, the sidewall patterns 53 are removed from over the processing target layer 58 while leaving the sidewall patterns 54 on the processing target layer 58.

Figure 20C:
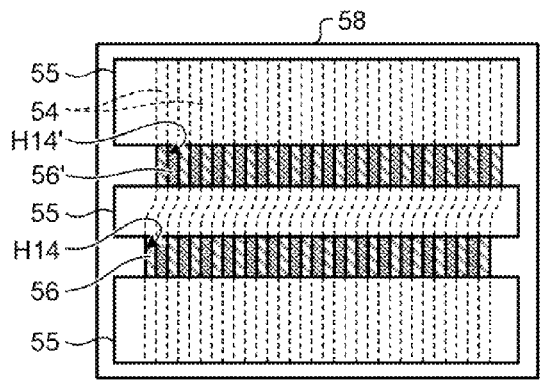

Next, as shown in FIG. 20C, mask patterns 55 that cover part of the spaces between the sidewall patterns 34 are formed on the processing target layer 58 by using the photolithography technology and the etching technology, thereby forming openings H14 and H14' surrounded by the sidewall patterns 54 and the mask patterns 55. At this time, the openings H14 and H14' can be arranged in two rows in an orthogonal direction with respect to the wiring direction DH. Moreover, the openings H14' of the first row are offset from the openings H14 of the second row by the wiring pitch PH in an orthogonal direction with respect to the wiring direction DH. A resist material or a hard mask material, such as a BSG film and a silicon nitride film, may be used as the material for the mask patterns 55.

Then, openings 56 and 56' formed by transferring the Openings H14 and H14' are formed in the processing target layer 58 by etching the processing target layer 58 via the openings H14 and H14'. At this time, the openings 56 and 56' can be arranged in two rows in an orthogonal direction with respect to the wiring direction DH. Moreover, the openings 56' of the first row are offset from the openings 56 of the second row by the wiring pitch PH in an orthogonal direction with respect to the wiring direction DH.

Figure 20D:
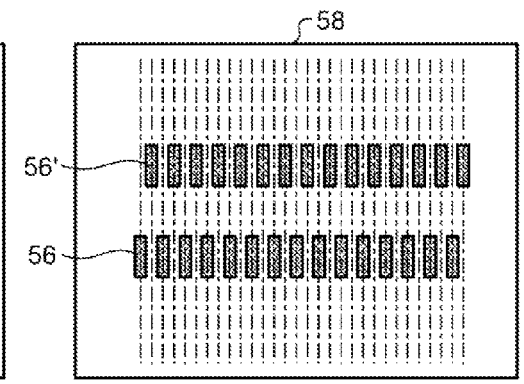

Then, as shown in FIG. 20D, the sidewall patterns 54 and the mask patterns 55 are removed from over the processing target layer 58 in which the openings 56 and 56' are formed. Thus, wires arranged in parallel at the wiring pitch PH in an orthogonal direction with respect to the wiring direction DH can be formed on the openings 56 and 56' along the wiring direction DH. The width of the wires can be set to ½ of the wiring pitch PH.

The openings 56 and 56' are formed in the regions partitioned by the sidewall patterns 54, therefore, even when the wiring pitch PH is set equal to or less than the resolution of the lithography, the contacts can be formed in the wires by arranging the openings 56 and 56' in two rows.

While certain embodiments have been described, these embodiments have been presented by way of example only, and are not intended to limit the scope of the inventions, Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is;

1. A manufacturing method of a semiconductor device comprising:
    forming core patterns, onto which a plurality of linear shaped first mask patterns, each of which is offset in three stages by a wiring pitch in an orthogonal direction with respect to a wiring direction, is transferred, on a processing target layer;
    forming first sidewall patterns on sidewalls of the core patterns;
    removing the core patterns while leaving the first sidewall patterns on the processing target layer;
    forming second sidewall patterns on sidewalls of the first sidewall patterns in such a way that sidewalls facing each other with a space between the first sidewall patterns therebetween are brought into contact with each other at a bent portion of the first sidewall patterns; and
    forming openings in the processing target layer by processing the processing target layer exposed from the first and second sidewall patterns.

2. The manufacturing method of a semiconductor device according to claim 1, wherein the first mask pattern is offset back and forth in an orthogonal direction with respect to the wiring direction of wires.

3. The manufacturing method of a semiconductor device according to claim 2, wherein the first mask pattern is offset in a same direction In a first stage and a third stage and is offset in an opposite direction in a second stage.

4. The manufacturing method of a semiconductor device according to claim 1, wherein the first mask pattern is offset in a stepwise manner in an orthogonal direction with respect to the wiring direction of wires.

5. The manufacturing method of a semiconductor device according to claim 1, further comprising slimming the core patterns before forming the first sidewall patterns.

6. The manufacturing method of a semiconductor device according to claim 1, further comprising:
    forming an active area isolated by a trench in an NAND flash memory;
    forming the processing target layer on the active area;
    embedding a contact material in the openings; and
    forming an upper layer wire connected to the active area via the contact material on the processing target layer.

7. The manufacturing method of a semiconductor device according to claim 1, further comprising:
    forming a lower layer wire on an underlying layer;
    forming the processing target layer on the lower layer wire;
    embedding a contact material in the openings; and
    forming an upper layer wire connected to the lower layer wire via the contact material on the processing target layer.

* * * * *